(12) United States Patent
Okabe et al.

(10) Patent No.: US 11,659,749 B2
(45) Date of Patent: May 23, 2023

(54) DISPLAY DEVICE

(71) Applicant: SHARP KABUSHIKI KAISHA, Sakai (JP)

(72) Inventors: Tohru Okabe, Sakai (JP); Shinsuke Saida, Sakai (JP); Hiroki Taniyama, Sakai (JP); Ryosuke Gunji, Sakai (JP); Shinji Ichikawa, Sakai (JP); Kohji Ariga, Aioi (JP); Akira Inoue, Yonago (JP); Yoshihiro Kohara, Yonago (JP); Koji Tanimura, Yonago (JP); Yoshihiro Nakada, Yonago (JP); Hiroharu Jinmura, Yonago (JP)

(73) Assignee: SHARP KABUSHIKI KAISHA, Osaka (JP)

(*) Notice: Subject to any disclaimer, the term of this patent is extended or adjusted under 35 U.S.C. 154(b) by 410 days.

(21) Appl. No.: 17/054,004

(22) PCT Filed: May 10, 2018

(86) PCT No.: PCT/JP2018/018061
§ 371 (c)(1),
(2) Date: Nov. 9, 2020

(87) PCT Pub. No.: WO2019/215863
PCT Pub. Date: Nov. 14, 2019

(65) Prior Publication Data
US 2021/0367027 A1 Nov. 25, 2021

(51) Int. Cl.
*H10K 59/131* (2023.01)
*H10K 77/10* (2023.01)
*H10K 102/00* (2023.01)

(52) U.S. Cl.
CPC ....... *H10K 59/1315* (2023.02); *H10K 77/111* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 10,847,545 B2* | 11/2020 | Lee | H10K 77/111 |
| 2014/0353670 A1 | 12/2014 | Youn et al. | |
| 2015/0287750 A1 | 10/2015 | Youn et al. | |
| 2019/0096975 A1* | 3/2019 | Park | H10K 50/844 |
| 2019/0131367 A1* | 5/2019 | Kim | H10K 59/122 |
| 2021/0336061 A1* | 10/2021 | Son | H01L 27/1262 |

FOREIGN PATENT DOCUMENTS

JP 2014-232300 A 12/2014

* cited by examiner

*Primary Examiner* — J. E. Schoenholtz
(74) *Attorney, Agent, or Firm* — ScienBiziP, P.C.

(57) ABSTRACT

In a display region, each first power-source line and each second power-source line intersecting with the first power-source line are electrically connected together via a contact hole in a second inorganic insulating film. In addition, each source line and each second power-source line intersect with each other via the second inorganic insulating film and a first organic insulating film.

12 Claims, 13 Drawing Sheets

DISPLAY DEVICE

TECHNICAL FIELD

The invention disclosure relates to a display device.

BACKGROUND ART

Attention has been recently drawn to self-emission organic EL display devices using organic electroluminescence (EL) elements, as display devices instead of liquid-crystal displays. One of such organic EL display devices that has been proposed is a flexible organic EL display device in which the organic EL elements and other components are mounted on a flexible resin substrate. The organic EL display device herein has a rectangular display region for image display. Around the display region is a frame region, which needs to be scaled down. In the flexible organic EL display device, bending the frame region for scale-down can break wires located at the bending portion in the frame region.

For instance, Patent Literature 1 discloses a flexible display device that has a bending hole, so that each of a buffer film, gate insulating film and interlayer insulating film corresponding to a bending region corresponding to the bending portion is partly removed to avoid a wire break.

CITATION LIST

Patent Literature

Patent Literature 1: Japanese Patent Application Laid-Open No. 2014-232300

SUMMARY

Technical Problem

A flexible organic EL display device has a resin substrate provided with inorganic insulating films, such as a base coat film, a gate insulating film, and an interlayer insulating film. In some cases, the inorganic insulating films at the bending portion are removed to form a flattening film, and routed wires are formed onto the flattening film, in order to prevent a break in the routed wires at the bending portion in the frame region.

In addition to a plurality of gate lines and a plurality of source lines, the display region of the organic EL display device includes a plurality of power-source lines extending in parallel with each other. Here, the power-source lines need to have low resistance, because the resistance of the wires causes voltage drop, thus leading to possible brightness unevenness. Proposed power-source lines consist of first power-source lines extending in parallel with the source lines, and of second power-source lines extending in parallel with the gate lines. However, the first power-source lines in the same layer and of the same material as the source lines, and the second power-source lines in the same layer and of the same material as a conductive layer, which is located between the gate and source lines, can develop a short circuit at the intersections of the source lines and the second power-source lines. Such a short circuit causes a line defect in the display region, thus requiring improvement.

To solve the above problem, it is an object of the disclosure to prevent a short circuit between the source lines and the second power-source lines.

Solution to Problem

To solve the problem, a display device according to the disclosure includes the following: a resin substrate; a TFT layer disposed on the resin substrate and having a stack of, in sequence, a first metal film, a first inorganic insulating film, a second metal film, a second inorganic insulating film, a first organic insulating film, a third metal film, and a second organic insulating film; a light-emitting element disposed on the TFT layer and forming a display region; a frame region disposed around the display region; a terminal section disposed at an end of the frame region; a bending portion extending in one direction between the display region and the terminal section; a plurality of gate lines forming the TFT layer, extending in parallel with each other in the display region, and composed of the first metal film; a plurality of source lines forming the TFT layer, extending, in the display region, in parallel with each other in a direction where the plurality of source lines intersect with the plurality of gate lines, and composed of the third metal film; a plurality of first power-source lines forming the TFT layer, extending, in the display region, in parallel with each other between the plurality of source lines, and composed of the third metal film; a plurality of second power-source lines forming the TFT layer, extending, in the display region, in parallel with each other between the plurality of gate lines, and composed of the second metal film; and a plurality of routed wires forming the TFT layer, extending, in the frame region, in parallel with each other in a direction intersecting with the one direction where the bending portion extends, and composed of the third metal film. The bending portion includes the following: a slit disposed in the first and second inorganic insulating films; a first resin layer filling the slit and composed of the first organic insulating film; the plurality of routed wires disposed on the first resin layer; and a second resin layer covering the plurality of routed wires and composed of the second organic insulating film. Each first power-source line and each second power-source line intersecting with each first power-source line are electrically connected together via a contact hole disposed in the second inorganic insulating film. Each source line and each second power-source line intersect with each other via the second inorganic insulating film and the first organic insulating film.

Advantageous Effect of Disclosure

According to the disclosure, each source line and each second power-source line intersect with each other via the second inorganic insulating film and the first organic insulating film, thereby preventing a short circuit between the source line and the second power-source line.

DESCRIPTION OF EMBODIMENTS

Embodiments of the disclosure will be detailed with reference to the drawings. The disclosure is not limited to the following embodiments.

FIRST EMBODIMENT

Figure 1:
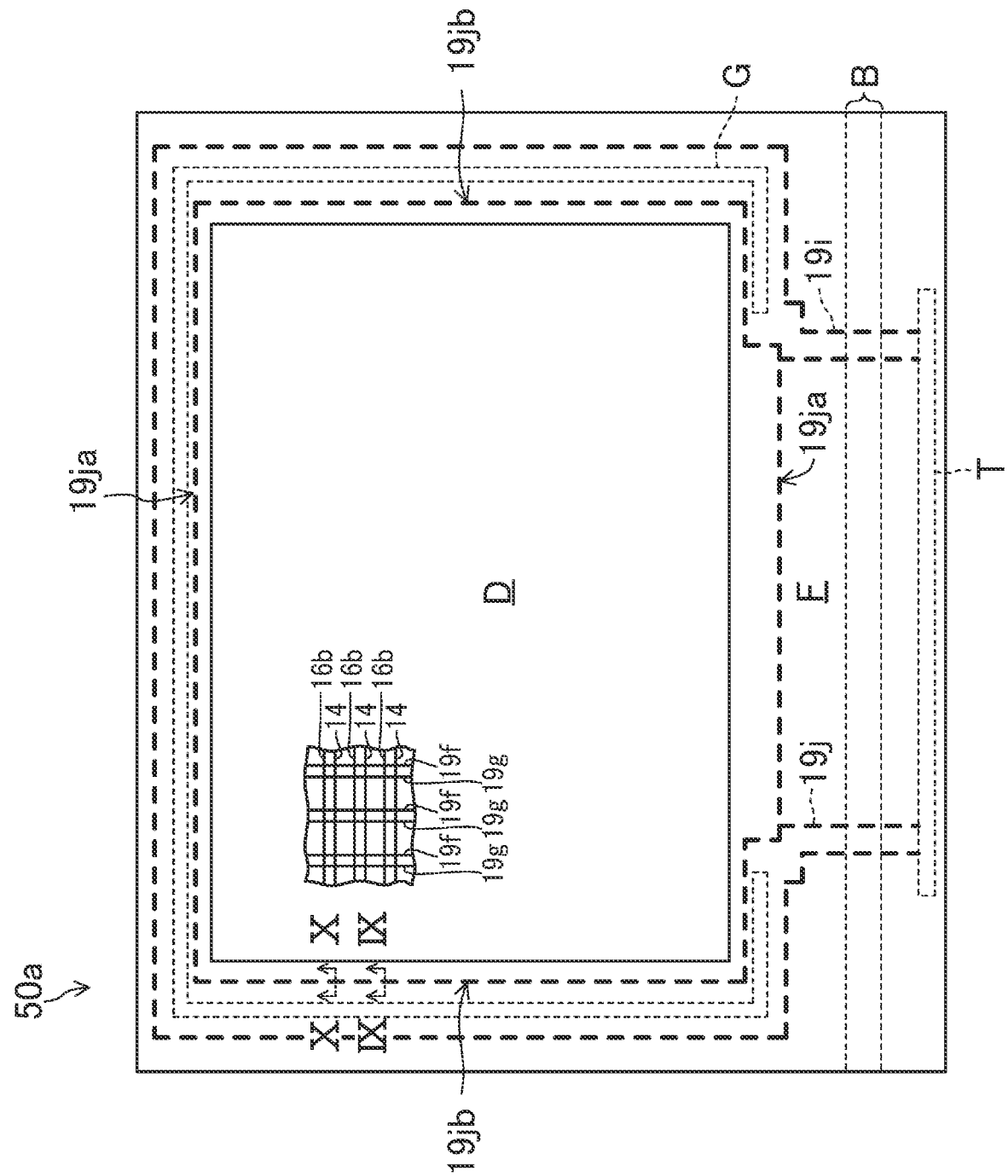
FIG. 1 is a schematic plan view of the configuration of an organic EL display device according to a first embodiment of the disclosure.
Figure 2:
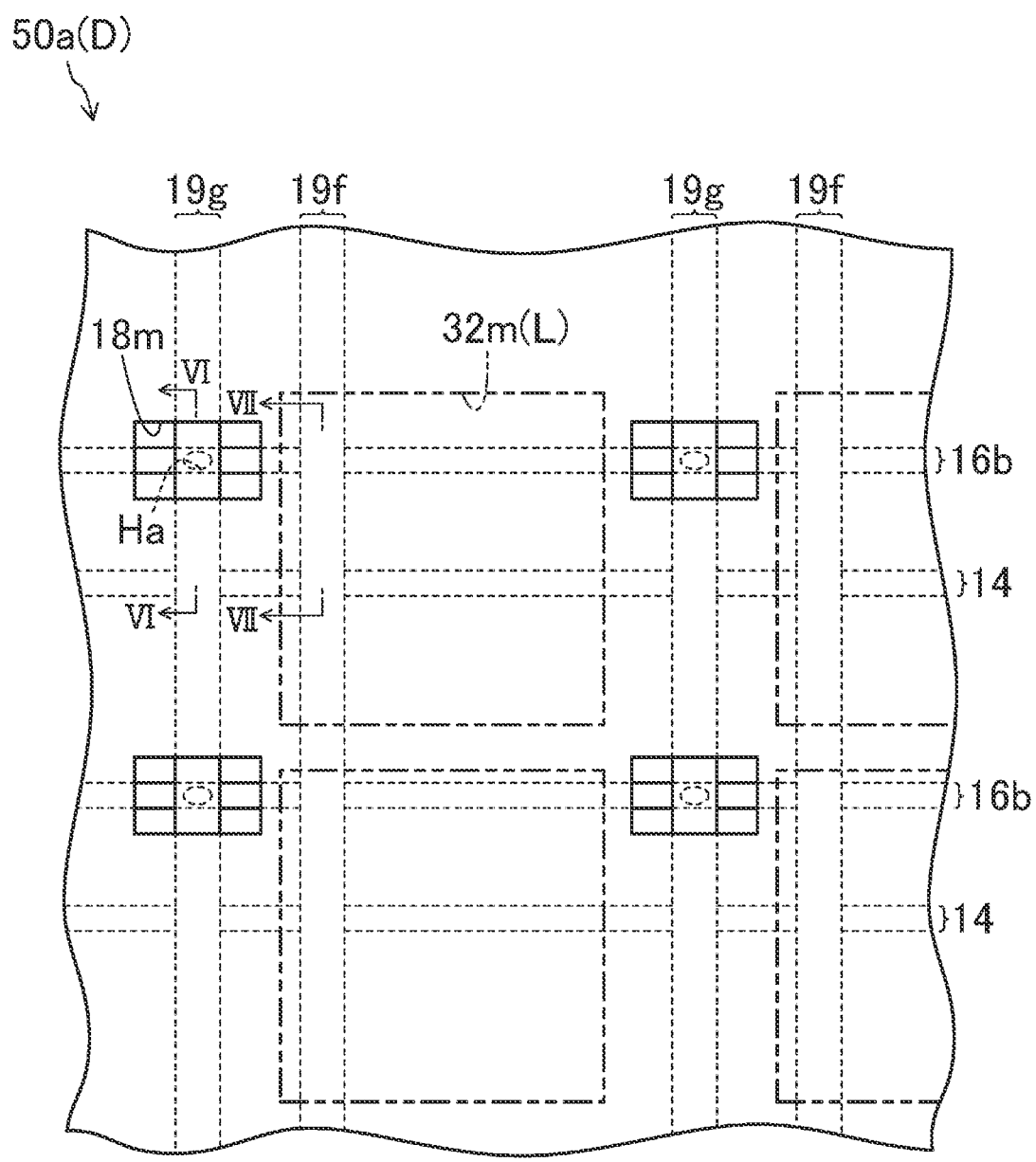
FIG. 2 is a plan view of a display region of the organic EL display device according to the first embodiment of the disclosure.
Figure 3:
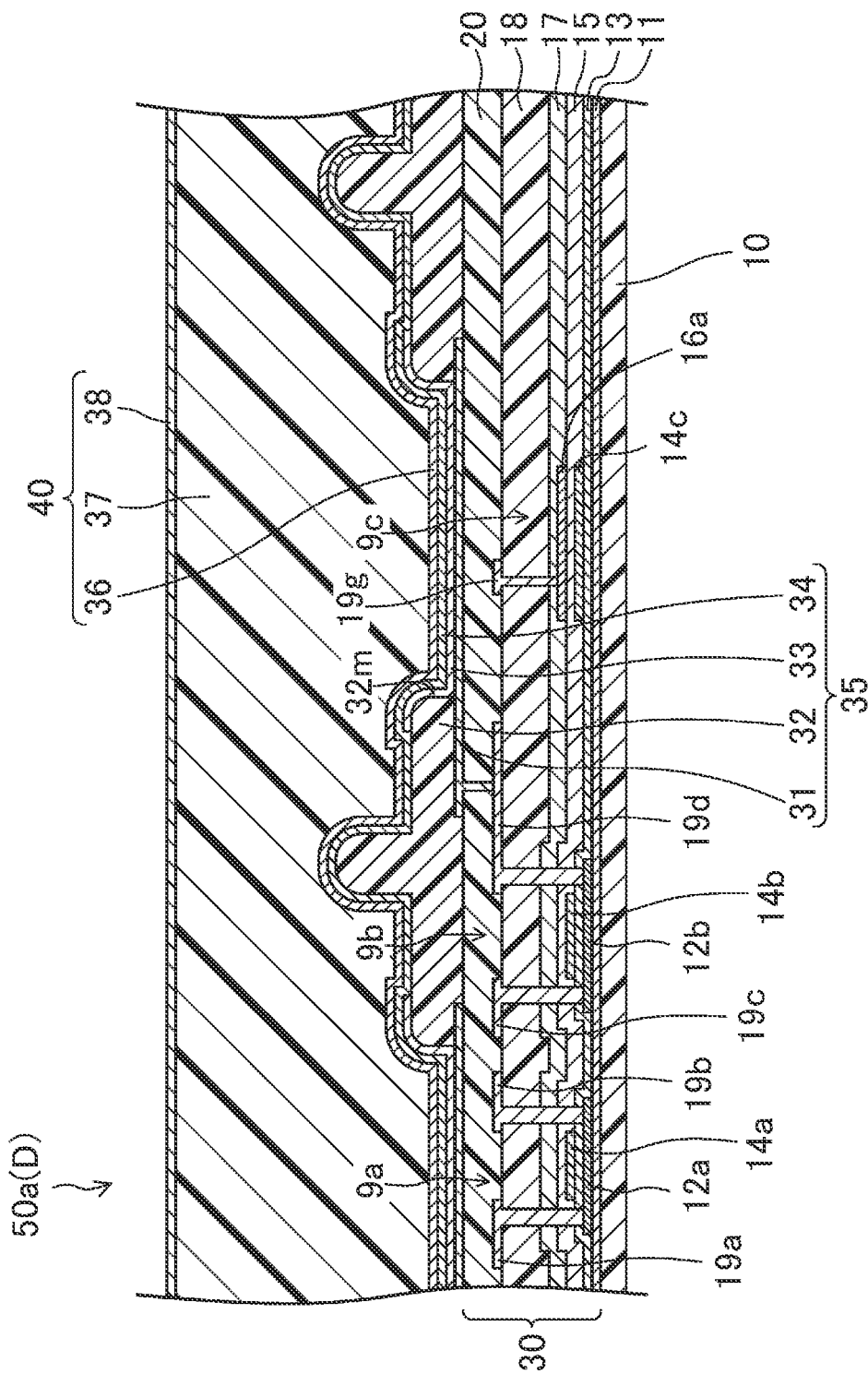
FIG. 3 is a cross-sectional view of the display region of the organic EL display device according to the first embodiment of the disclosure.
Figure 4:
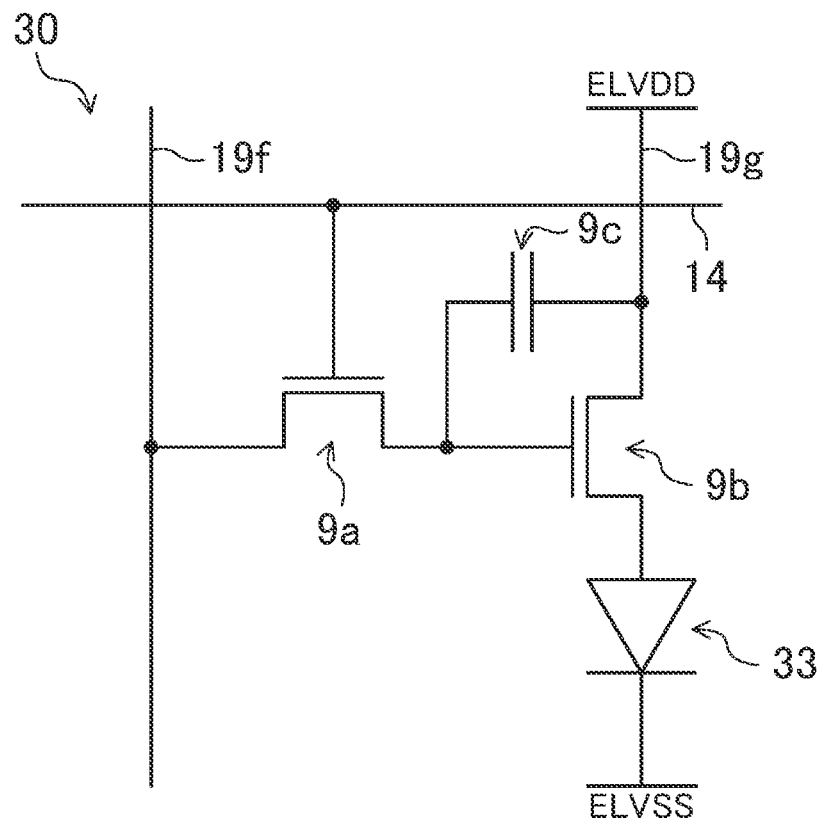
FIG. 4 is an equivalent circuit diagram of a TFT layer forming the organic EL display device according to the first embodiment of the disclosure.
Figure 5:
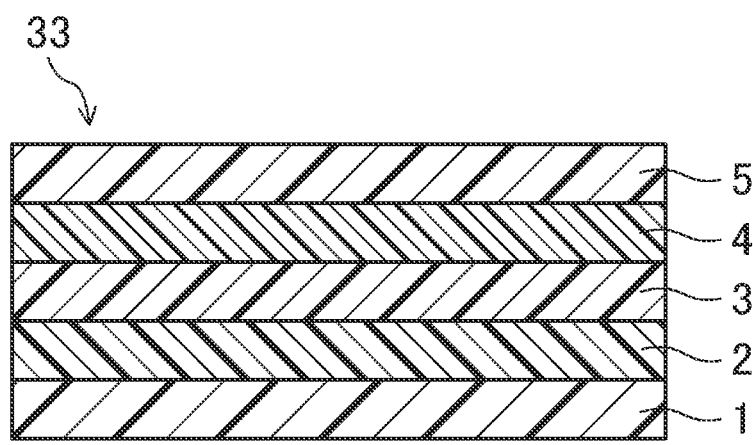
FIG. 5 is a cross-sectional view of an organic EL layer forming the organic EL display device according to the first embodiment of the disclosure.
Figure 6:
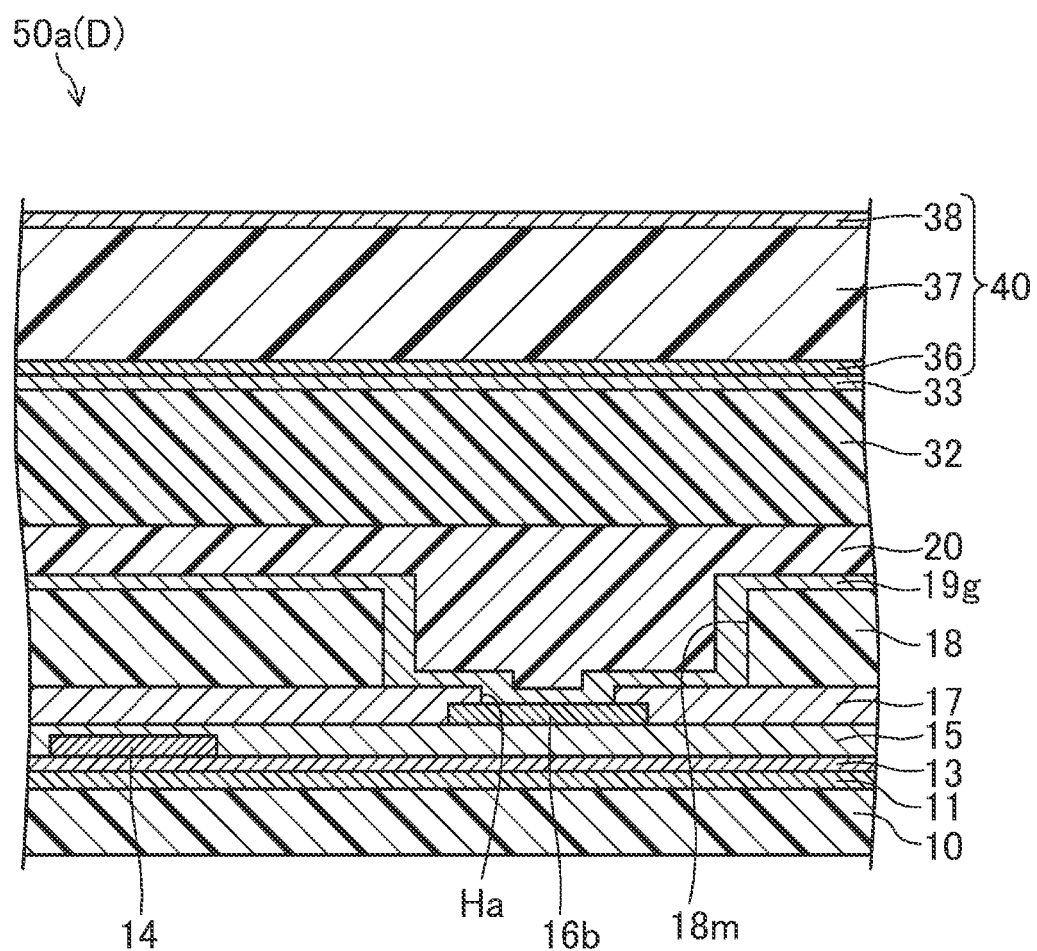
FIG. 6 is a cross-sectional view of the display region of the organic EL display device, taken along line VI-VI in FIG. 2.
Figure 7:
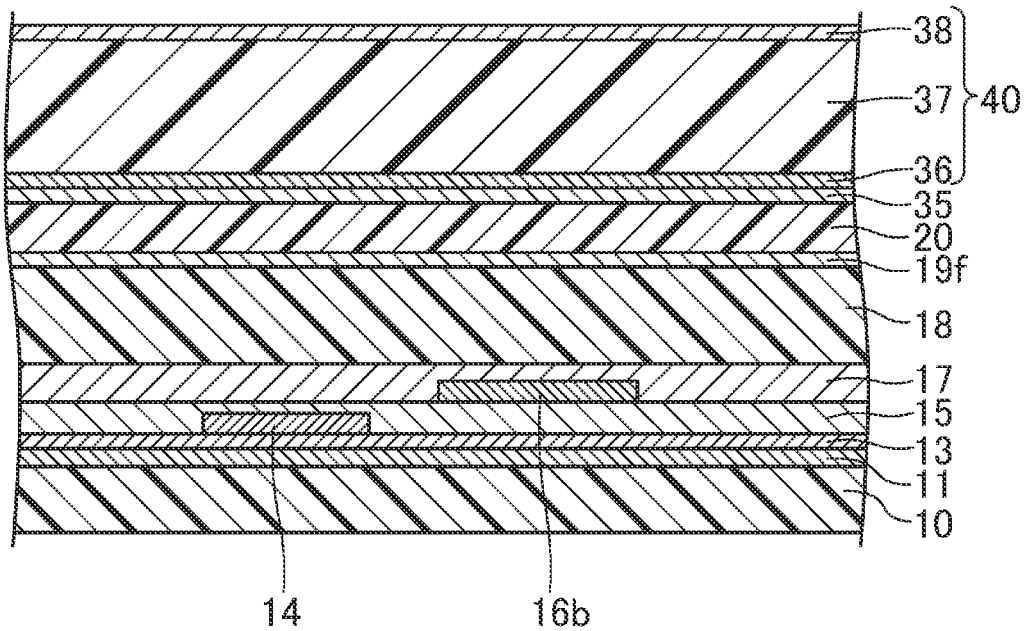
FIG. 7 is a cross-sectional view of the display region of the organic EL display device, taken along line VII-VII in FIG. 2.
Figure 8:
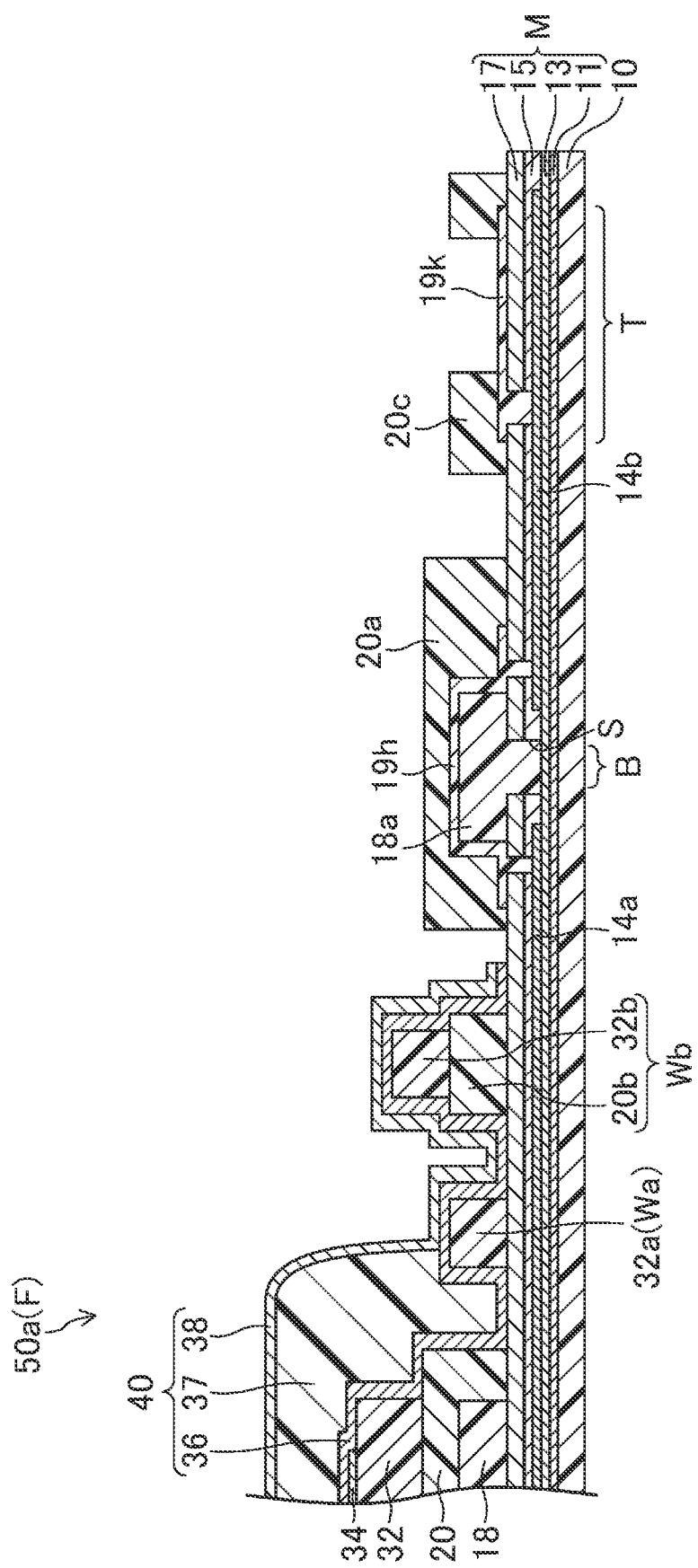
FIG. 8 is a cross-sectional view of a frame region of the organic EL display device according to the first embodiment of the disclosure.
Figure 9:
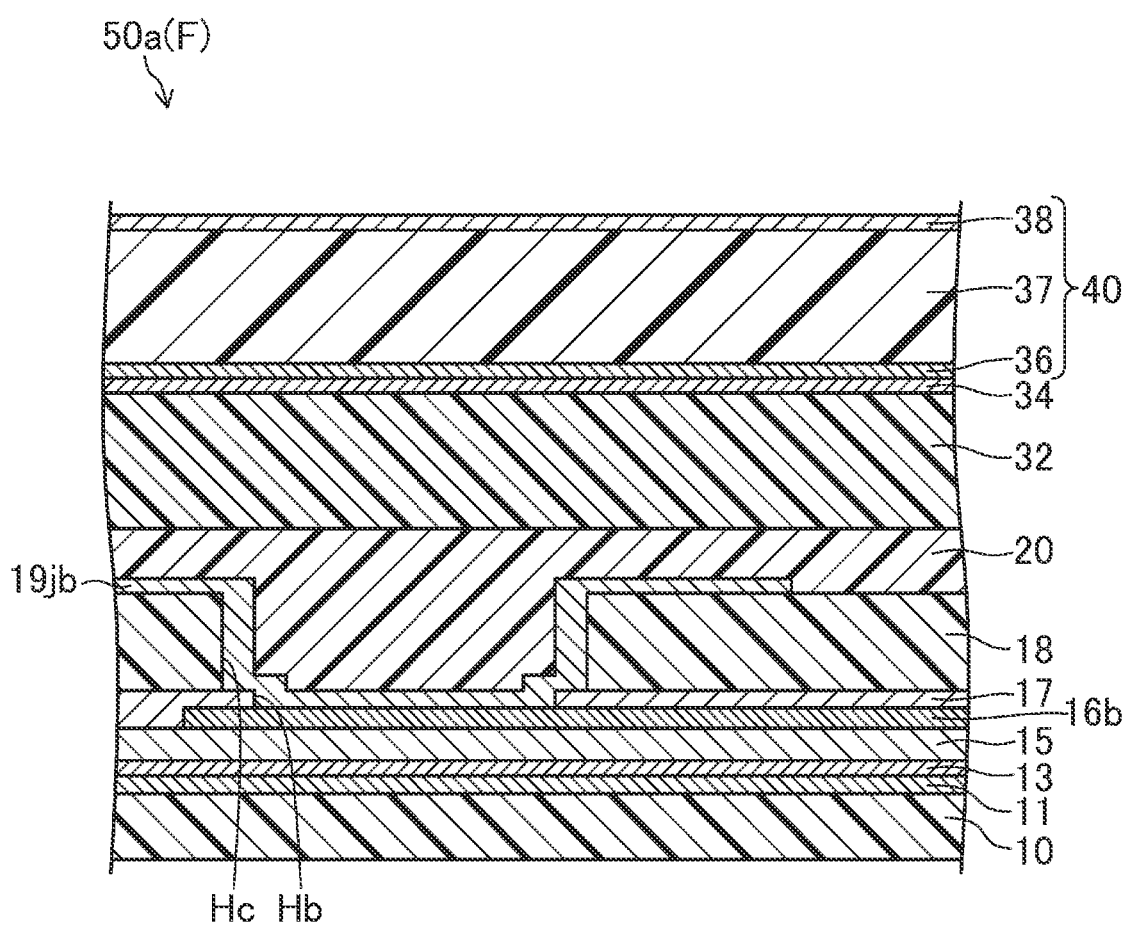
FIG. 9 is a cross-sectional view of the frame region of the organic EL display device, taken along line IX-IX in FIG. 1.
Figure 10:
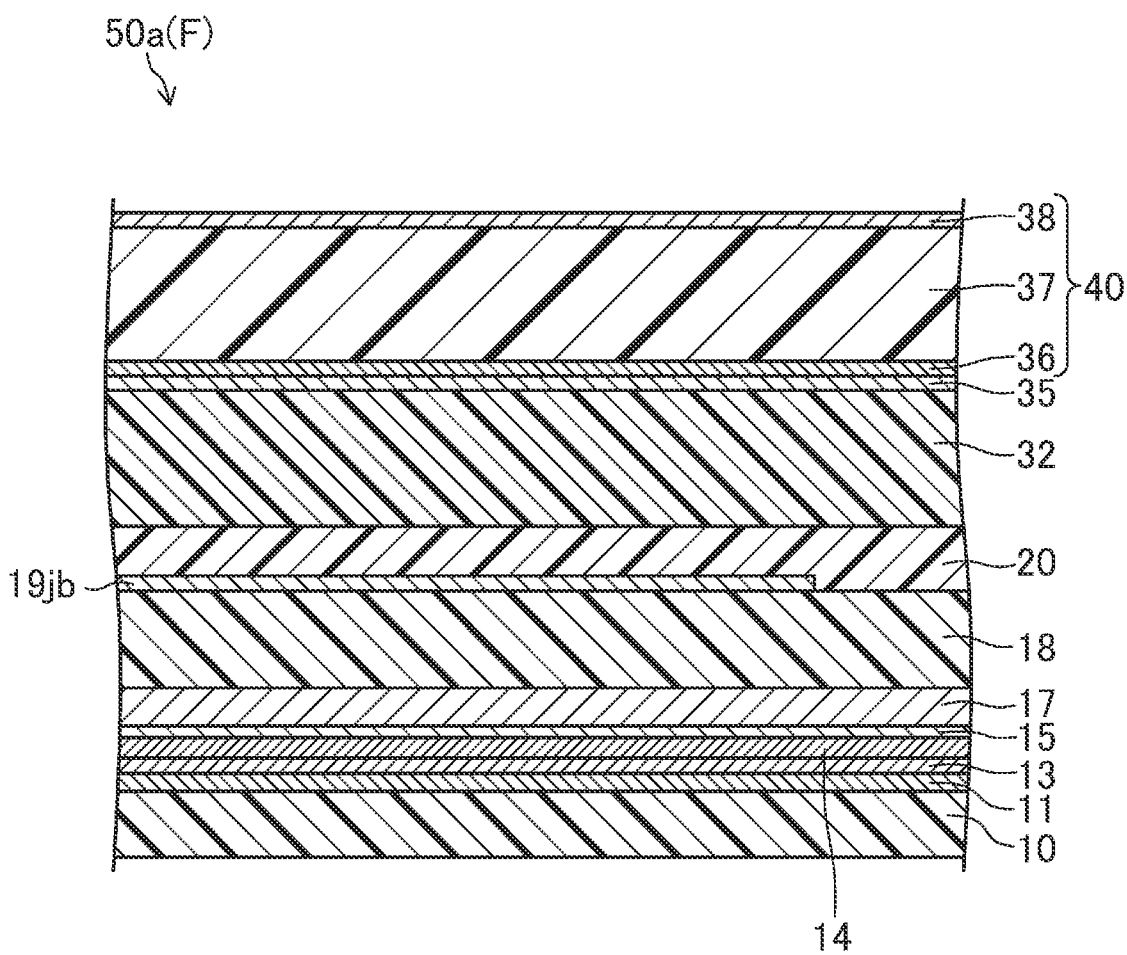
FIG. 10 is a cross-sectional view of the frame region of the organic EL display device, taken along line X-X in FIG. 1.
Figure 11:
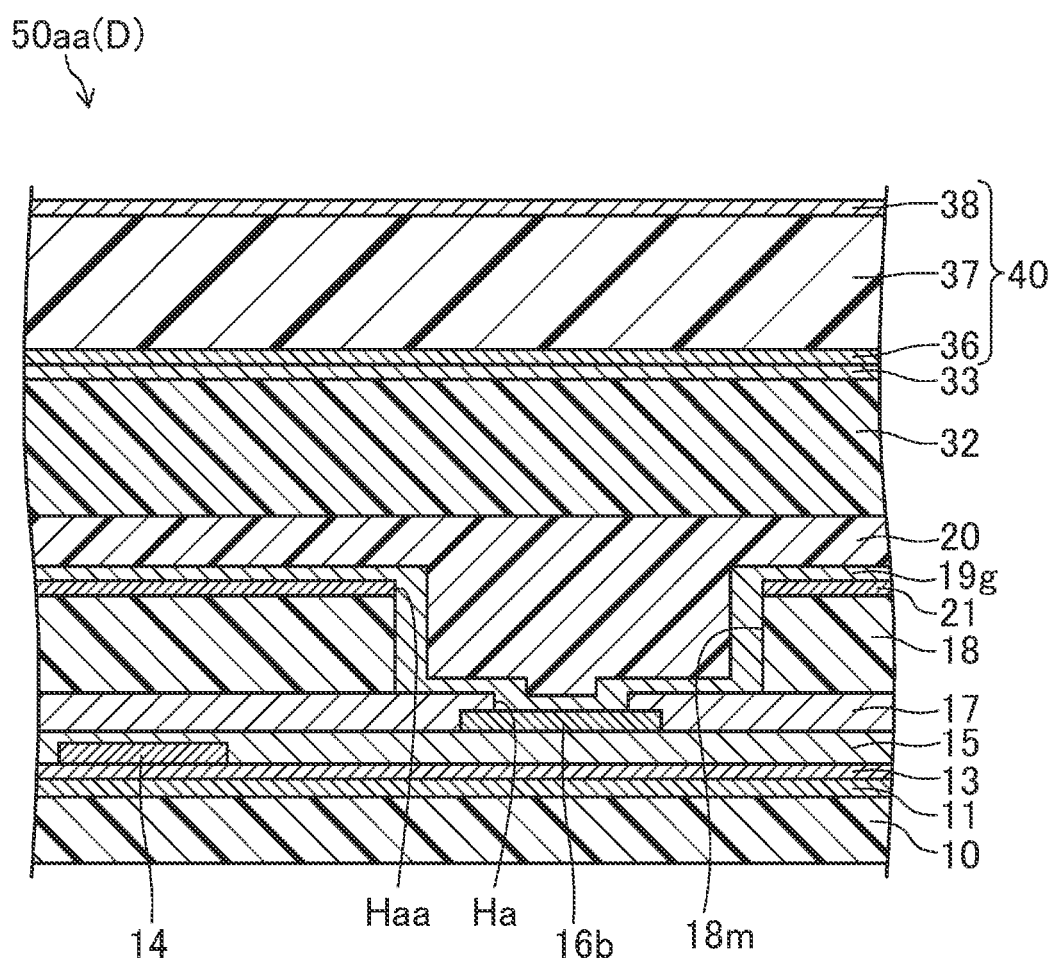
FIG. 11 is a cross-sectional view of the display region of an organic EL display device according to a modification of the first embodiment of the disclosure, and corresponds to FIG. 6.
Figure 12:
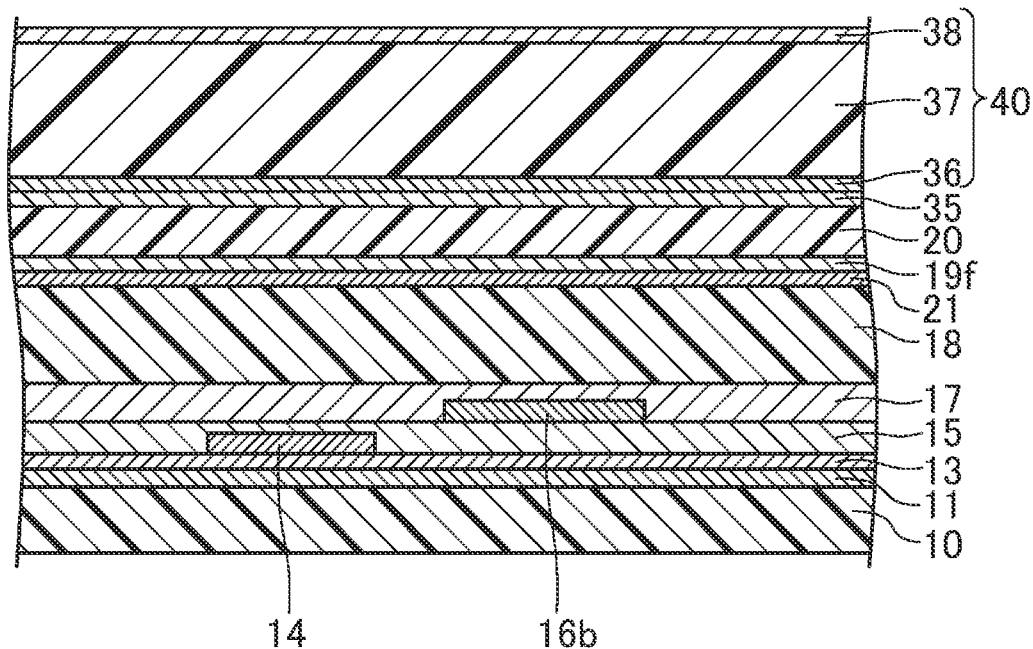
FIG. 12 is a cross-sectional view of the display region of the organic EL display device according to the modification of the first embodiment of the disclosure, and corresponds to FIG. 7.

FIGS. 1 to 12 illustrate a first embodiment of a display device according to the disclosure. Each embodiment describes, by way of example, an organic EL display device that includes organic EL elements, as a display device that includes light-emitting elements. FIG. 1 is a schematic plan view of the configuration of an organic EL display device 50*a* according to this embodiment. FIGS. 2 and 3 are plan view and cross-sectional view of a display region D of the organic EL display device 50*a*. FIG. 4 is an equivalent circuit diagram of a TFT layer 30 forming the organic EL display device 50*a*. FIG. 5 is a cross-sectional view of an organic EL layer 33 forming the organic EL display device 50*a*. FIGS. 6 and 7 are cross-sectional views of the display region D of the organic EL display device 50*a*, taken along line VI-VI and line VII-VII in FIG. 2. FIG. 8 is a cross-sectional view of a frame region F of the organic EL display device 50*a*. FIGS. 9 and 10 are cross-sectional views of the frame region F of the organic EL display device 50*a*, taken along line IX-IX and line X-X in FIG. 1. FIGS. 11 and 12 are cross-sectional views of the display region D of an organic EL display device 50*aa*, which is a modified version of the organic EL display device 50*a*, and correspond to FIGS. 6 and 7.

As illustrated in FIG. 1, the organic EL display device 50*a* includes the display region D having a rectangular shape and provided for image display, and includes the frame region F disposed around the display region D.

In the display region D are a plurality of sub-pixels arranged in matrix. Further, arranged in the display region D are a sub-pixel having a light-emission region L (c.f., FIG. 2) for red display, a sub-pixel having a light-emission region L for green display, and a sub-pixel having a light-emission region L for blue display, and these sub-pixels are adjacent to each other. In the display region D, three adjacent sub-pixels having red, green, and blue light-emission regions L constitute one pixel.

The frame region F has a terminal section T at its lower end in FIG. 1. The frame region F also has a bending portion B extending in one direction (the lateral direction of the drawing) between the display region D and the terminal section T, as illustrated in FIG. 1. The bending portion B is 180° (U-shape) bendable about an axis in the lateral direction of the drawing. The frame region F also has a substantially C-shaped trench G disposed in a first flattening film 18 (described later on) and surrounding the display region D, as illustrated in FIG. 1. The trench G has a substantial C-shape having an opening near the terminal section T in plan view, as illustrated in FIG. 1.

The organic EL display device 50*a* includes the following components in the display region D, as illustrated in FIG. 3: a resin substrate layer 10 serving as a resin substrate; the thin-film-transistor (TFT) layer 30 disposed on the resin substrate layer 10; an organic EL element 35 disposed on the TFT layer 30 and serving as light-emitting elements forming the display region D; and a sealing film 40 disposed over the organic EL element 35.

The resin substrate layer 10 is made of, for instance, polyimide resin.

The TFT layer 30 includes the following components, as illustrated in FIG. 3: a base coat film 11 disposed on the resin substrate layer 10; a plurality of first TFTs 9*a*, a plurality of second TFTs 9*b* and a plurality of capacitors 9*c* all disposed on the base coat film 11; and a second flattening film 20 disposed on each first TFT 9*a*, each second TFT 9*b*, and each capacitor 9*c*. As illustrated in FIGS. 1, 2, and 4, disposed in the TFT layer 30 are a plurality of gate lines 14 extending in parallel with each other in the lateral directions of the drawings. As illustrated in FIGS. 1, 2, and 4, disposed in the TFT layer 30 are a plurality of second power-source lines 16*b* extending in parallel with each other in the lateral directions of the drawings. Each second power-source line 16*b* is adjacent to each gate line 14, as illustrated in FIGS. 1 and 2. As illustrated in FIGS. 1, 2, and 4, disposed in the TFT layer 30 are a plurality of source lines 19*f* extending in parallel with each other in the longitudinal directions of the drawings. As illustrated in FIGS. 1, 2, and 4, disposed in the TFT layer 30 are a plurality of first power-source lines 19*g* extending in parallel with each other in the lateral directions of the drawings. Each first power-source line 19*g* is adjacent to each source line 19*f*, as illustrated in FIGS. 1 and 2. In the TFT layer 30, each sub-pixel has the first TFT 9*a*, the second TFT 9*b*, and the capacitor 9*c*, as illustrated in FIG. 4. The TFT layer 30 includes the following films stacked in sequence: a first metal film forming the gate lines 14; a first interlayer insulating film 15 serving as a first inorganic insulating film; a second metal film forming the second power-source lines 16*b*; a second interlayer insulating film 17 serving as a second inorganic insulating film; the first flattening film 18 serving as a first organic insulating film; a third metal film forming the source lines 19*f* and the first power-source lines 19*g*; and the second flattening film 20 serving as a second organic insulating film. In the TFT layer 30, each first power-source line 19*g* and each second power-source line 16*b* intersecting with each first power-source line

19g are electrically connected together in the display region D via a contact hole Ha disposed in the second interlayer insulating film 17, as illustrated in FIGS. 2 and 6. At the intersection of each first power-source line 19g and each second power-source line 16b, the first flattening film 18 has an opening 18m surrounding the contact hole Ha of the second inorganic insulating film 17, as illustrated in FIGS. 2 and 6. In the TFT layer 30, each source line 19f and each second power-source line 16b intersect with each other in the display region D via the second interlayer insulating film 17 and the first flattening film 18, as illustrated in FIGS. 2 and 7. In the TFT layer 30, each gate line 14 and each source line 19f intersect with each other in the display region D via the first interlayer insulating film 15, the second interlayer insulating film 17, and the first flattening film 18, as illustrated in FIG. 7. In the TFT layer 30, each gate line 14 and each first power-source line 19g intersect with each other in the display region D via the first interlayer insulating film 15, the second interlayer insulating film 17, and the first flattening film 18, as illustrated in FIG. 6.

This embodiment describes, by way of example, the second power-source lines 16b composed of the second metal film; in some embodiments, such second power-source lines may be composed of the first metal film. In this case, each second power-source line is electrically connected to the corresponding first power-source line 19g via a contact hole disposed in a stacked film of the first interlayer insulating film 15 and second interlayer insulating film 17, and intersects with the corresponding source line 19f via the first interlayer insulating film 15, the second interlayer insulating film 17, and the first flattening film 18.

This embodiment describes, by way of example, that the third metal film, which forms the source lines 19f, the first power-source lines 19g, and other things, is stacked on the first flattening film 18; in some embodiments, a third inorganic insulating film 21 of silicon nitride, silicon oxide, silicon oxide nitride, or other materials may be disposed between the first flattening film 18 and the third metal film, like an organic EL display device 50aa in a modification illustrated in FIGS. 11 and 12. The organic EL display device 50aa can prevent contamination resulting from a resin material within the chamber of a dry-etching apparatus, because the surface of the first flattening film 18 is not exposed when the third metal film undergoes patterning through dry-etching. In the organic EL display device 50aa, each first power-source line 19g and each second power-source line 16b intersecting with each first power-source line 19g are, as illustrated in FIG. 11, electrically connected together via the contact hole Ha and a contact hole Haa disposed in the second interlayer insulating film 17 and the third inorganic insulating film 21, and via the opening 18m disposed in the first flattening film 18. In the organic EL display device 50aa, each source line 19f and each second power-source line 16b intersect with each other via the second interlayer insulating film 17, the first flattening film 18, and the third inorganic insulating film 21, as illustrated in FIG. 12. It is noted that the third inorganic insulating film 21 is desirably not disposed at the bending portion B of the frame region F in order to prevent the inorganic insulating films from a break in bending.

The base coat film 11 is composed of an inorganic insulating monolayer film of, for instance, silicon nitride, silicon oxide, or silicon oxide nitride, or is composed of an inorganic insulating laminated film of these materials.

The first TFT 9a is electrically connected to the corresponding gate line 14 and source line 19f in each sub-pixel, as illustrated in FIG. 4. The first TFT 9a includes the following components sequentially disposed on the base coat film 11, as illustrated in FIG. 3: a semiconductor layer 12a, a gate insulating film 13, a gate electrode 14a, the first interlayer insulating film 15, the second interlayer insulating film 17, the first flattening film 18, a source electrode 19a, and a drain electrode 19b. Here, the semiconductor layer 12a is in the form of islands on the base coat film 11, as illustrated in FIG. 3, and has channel, source, and drain regions, which will be described later on. In addition, the gate insulating film 13 is disposed over the semiconductor layer 12a, as illustrated in FIG. 3. In addition, the gate electrode 14a overlaps, on the gate insulating film 13, the channel region of the semiconductor layer 12a, as illustrated in FIG. 3. In addition, the first interlayer insulating film 15, the second interlayer insulating film 17, and the first flattening film 18 are sequentially disposed over the gate electrode 14a, as illustrated in FIG. 3. In addition, the source electrode 19a and the drain electrode 19b are spaced from each other on the first flattening film 18, as illustrated in FIG. 3. The source electrode 19a and the drain electrode 19b are electrically connected to the source and drain regions of the semiconductor layer 12a, respectively, via respective contact holes disposed in the stacked film of the gate insulating film 13, first interlayer insulating film 15, second interlayer insulating film 17, and first flattening film 18, as illustrated in FIG. 3. Herein, the gate insulating film 13a, the first interlayer insulating film 15, and the second interlayer insulating film 17 are composed of an inorganic insulating monolayer film of, for instance, silicon nitride, silicon oxide, or silicon oxide nitride, or is composed of an inorganic insulating laminated film of these materials. In addition, the first flattening film 18 has a flat surface in the display region D and is made of an organic resin material, such as polyimide resin.

The second TFT 9b is electrically connected to the corresponding first TFT 9a and first power-source line 19g in each sub-pixel, as illustrated in FIG. 4. The second TFT 9b includes the following components sequentially disposed on the base coat film 11, as illustrated in FIG. 3: a semiconductor layer 12b, the gate insulating film 13, a gate electrode 14b, the first interlayer insulating film 15, the second interlayer insulating film 17, the first flattening film 18, a source electrode 19c, and a drain electrode 19d. Here, the semiconductor layer 12b is in the form of islands on the base coat film 11, as illustrated in FIG. 3, and has channel, source, and drain regions, like the semiconductor layer 12a. In addition, the gate insulating film 13 is disposed over the semiconductor layer 12b, as illustrated in FIG. 3. In addition, the gate electrode 14b overlaps, on the gate insulating film 13, the channel region of the semiconductor layer 12b, as illustrated in FIG. 3. In addition, the first interlayer insulating film 15, the second interlayer insulating film 17, and the first flattening film 18 are sequentially disposed over the gate electrode 14b, as illustrated in FIG. 3. In addition, the source electrode 19c and the drain electrode 19d are spaced from each other on the first flattening film 18, as illustrated in FIG. 3. The source electrode 19c and the drain electrode 19d are electrically connected to the source and drain regions of the semiconductor layer 12b, respectively, via respective contact holes disposed in the stacked film of the gate insulating film 13, first interlayer insulating film 15, second interlayer insulating film 17, and first flattening film 18, as illustrated in FIG. 3.

Although this embodiment describes, by way of example, the first TFT 9a and the second TFT 9b that are top-gate TFTs, these TFTs may be bottom-gate TFTs.

The capacitor 9c is electrically connected to the corresponding first TFT 9a and first power-source line 19g in each sub-pixel, as illustrated in FIG. 4. The capacitor 9c includes the following components, as illustrated in FIG. 3: a lower conductive layer 14c disposed in the same layer and made of the same material as, for instance, the gate electrode 14a; the first interlayer insulating film 15 disposed over the lower conductive layer 14c; and an upper conductive layer 16a disposed on the first interlayer insulating film 15 and overlapping the lower conductive layer 14c. Herein, the upper conductive layer 16a is electrically connected to the first power-source line 19g via a contact hole disposed in the second interlayer insulating film 17 and first flattening film 18, as illustrated in FIG. 3.

The second flattening film 20 has a flat surface in the display region D and is made of an organic resin material, such as polyimide resin. Although this embodiment describes, by way of example, the first flattening film 18 of polyimide resin and the second flattening film 20 of polyimide resin, these films may be made of an organic resin material, such as acrylic resin or polysiloxane resin.

The organic EL element 35 includes the following components sequentially disposed on the TFT layer 30, as illustrated in FIG. 3: a plurality of first electrodes 31, an edge cover 32, a plurality of organic EL layers 33, and a second electrode 34.

The first electrodes 31 are arranged in matrix on the second flattening film 20 as anodes corresponding to the sub-pixels, as illustrated in FIG. 3. As illustrated in FIG. 3, each first electrode 31 is electrically connected to the drain electrode 19d of each second TFT 9b via a contact hole disposed in the second flattening film 20. The first electrodes 31 are capable of injecting holes into the organic EL layers 33. The first electrodes 31 are more preferably made of a material having a large work function, in order to improve the efficiency of hole injection into the organic EL layers 33. The first electrodes 31 are made of a metal material, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). In some cases, the first electrodes 31 may be made of an alloy of, for instance, astatine (At) and astatine oxide ($AtO_2$). Alternatively, the first electrodes 31 may be made of a conductive oxide, such as tin oxide (SnO), zinc oxide (ZnO), indium tin oxide (ITO), or indium zinc oxide (IZO). In addition, the first electrodes 31 may be composed of a plurality of stacked layers made of the above materials. Here, examples of a compound material having a large work function include an indium tin oxide (ITO) and an indium zinc oxide (IZO).

The edge cover 32 is in the form of a lattice covering the perimeter of each first electrode 31, as illustrated in FIG. 3. The edge cover 32 has openings 32m each constituting the light-emission region L in each sub-pixel, as illustrated in FIG. 2. Moreover, the aforementioned opening 18m of the first flattening film 18 does not overlap the opening 32m of the edge cover 32, as illustrated in FIG. 2. That is, the first flattening film 18 overlaps the opening 32m of the edge cover 32. Here, the edge cover 32 is an organic film made of, for instance, polyimide resin, acrylic resin, or polysiloxane resin.

The plurality of organic EL layers 33 are disposed on the individual first electrodes 31 and arranged in matrix so as to correspond to the plurality of sub-pixels, as illustrated in FIG. 3. Each organic EL layer 33 includes the following layers sequentially disposed on the first electrode 31, as illustrated in FIG. 5: a hole injection layer 1, a hole transport layer 2, a light-emitting layer 3, an electron transport layer 4, and an electron injection layer 5.

The hole injection layer 1 is also called an anode buffer layer, and is capable of bringing the energy levels of the first electrode 31 and organic EL layer 33 close to each other to improve the efficiency of hole injection from the first electrode 31 to the organic EL layer 33. Examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 is capable of improving the efficiency of hole transport from the first electrode 31 to the organic EL layer 33. Examples of the material of the hole transport layer 2 include a porphyrin derivative, an aromatic tertiary amine compound, a styrylamine derivative, a polyvinylcarbazole, a poly-p-phenylenevinylene, a polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, a hydrogenated amorphous silicon, a hydrogenated amorphous silicon carbide, a zinc sulfide, and a zinc selenide.

The light-emitting layer 3 is a region where holes and electrons are injected from the first electrode 31 and second electrode 24 upon voltage application via the first electrode 31 and second electrode 34, and is a region where the holes and electrons rejoin. The light-emitting layer 3 is made of a material having high efficiency of light emission. Examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, a phenoxazone, a quinacridone derivative, a rubrene, a poly-p-phenylenevinylene, and a polysilane.

The electron transport layer 4 is capable of moving the electrons to the light-emitting layer 3 efficiently. The electron transport layer 4 is made of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 is capable of bringing the energy levels of the second electrode 34 and organic EL layer 33 close to each other to improve the efficiency of electron injection from the second electrode 34 to the organic EL layer 33. This function can lower voltage for driving the organic EL element 35. The electron injection layer 5 is also called a cathode buffer layer. Herein, examples of the material of the electron injection layer 5 include an inorganic alkali compound (e.g., LiF or lithium fluoride, MgF$_2$ or magnesium fluoride, CaF$_2$ or calcium fluoride, SrF$_2$ or strontium fluoride, and BaF$_2$ or barium fluoride), an aluminum oxide (Al$_2$O$_3$), and a strontium oxide (SrO).

The second electrode 34 is a cathode disposed over the individual organic EL layers 33 and the edge cover 32, as illustrated in FIG. 3. The second electrode 34 is capable of injecting the electrons into the organic EL layers 33. The second electrode 34 is more preferably made of a material having a small work function, in order to improve the efficiency of electron injection into the organic EL layers 33. Examples of the material of the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). The second electrode 34 may be made of, for instance, an alloy of magnesium (Mg) and copper (Cu), an alloy of magnesium (Mg) and silver (Ag), an alloy of sodium (Na) and potassium (K), an alloy of astatine (At) and astatine oxide (AtO$_2$), an alloy of lithium (Li) and aluminum (Al), an alloy of lithium (Li), calcium (Ca) and aluminum (Al), or an alloy of lithium fluoride (LiF), calcium (Ca) and aluminum (Al). Alternatively, the second electrode 34 may be made of a conductive oxide, such as tin oxide (SnO), zinc oxide (ZnO), indium tin oxide (ITO), or indium zinc oxide (IZO). The second electrode 34 may be composed of a plurality of stacked layers made of the above materials. Examples of the material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 3, the sealing film 40 is disposed over the second electrode 34 and includes the following films stacked sequentially on the second electrode 34: a first inorganic film 36, an organic film 37, and a second inorganic film 38. The sealing film 40 is capable of protecting the organic EL layers 33 of the organic EL element 35 from moisture and oxygen.

The first inorganic film 36 and the second inorganic film 38 are composed of an inorganic insulating film, such as a silicon nitride film, a silicon oxide film, or a silicon oxide nitride film.

The organic film 37 is made of an organic resin material, such as acrylic resin, epoxy resin, silicone resin, polyurea resin, parylene resin, polyimide resin, or polyamide resin.

The organic EL display device 50a includes the following components in the frame region F, as illustrated in FIG. 8: the resin substrate layer 10; an inorganic insulating laminated film M disposed on the resin substrate layer 10; a first barrier wall Wa, second barrier wall Wb, routed wires 19h, and terminal wires 19k disposed on the inorganic insulating laminated film M; and the sealing film 40 disposed over the first barrier wall Wa and the second barrier wall Wb.

As illustrated in FIG. 8, the inorganic insulating laminated film M consists of the base coat film 11, the gate insulating film 13, the first interlayer insulating film 15, and the second interlayer insulating film 17, which are sequentially disposed on the resin substrate layer 10. Here, the first interlayer insulating film 15 and second interlayer insulating film 17 of the inorganic insulating laminated film M have a slit S at the bending portion B, as illustrated in FIG. 8. The slit S is filled with a first resin layer 18a disposed in the same layer and made of the same material as the first flattening film 18, as illustrated in FIG. 8.

The first barrier wall Wa is provided in the form of a frame surrounding the display region D, and is designed to prevent the organic film 37 of the sealing film 40 from extension. The first barrier wall Wa is composed of a third resin layer 32a disposed in the same layer and made of the same material as the edge cover 32, as illustrated in FIG. 8.

The second barrier wall Wb is provided in the form of a frame surrounding the first barrier wall Wa, and is designed to prevent the organic film 37 of the sealing film 40 from extension. The second barrier wall Wb is composed of the following layers, as illustrated in FIG. 8: a fourth resin layer 20b disposed in the same layer and made of the same material as the second flattening film 20; and a fifth resin layer 32b disposed on the fourth resin layer 20b, disposed in the same layer, and made of the same material as the edge cover 32. In the frame region F, the organic film 37 of the sealing film 40 extends to the upper surface of the first barrier wall Wa in the drawing via the first inorganic film 36, as illustrated in FIG. 8. In addition, the first inorganic film 36 and second inorganic film 38 of the sealing film 40 are in contact with each other on the upper surface of the second barrier wall Wb, as illustrated in FIG. 8. Although this embodiment describes, by way of example, the organic film 37 obstructed by a side surface of the first barrier wall Wa adjacent to the display region D, the organic film 37 may extend to the upper surface of the second barrier wall Wb for instance.

The plurality of routed wires 19h extend in parallel with each other in a direction orthogonal to the direction where the bending portion B extends. Each routed wire 19h is routed on the first resin layer 18a and the second interlayer insulating film 17, as illustrated in FIG. 8. The routed wires 19h are disposed in the same layer and made of the same material (i.e., the third metal film) as the source electrode 19a and other components. As illustrated in FIG. 8, each routed wire 19h has both ends electrically connected to a first gate conductive layer 14a and a second gate conductive layer 14b, respectively, via respective contact holes disposed in the stacked film of the first interlayer insulating film 15 and second interlayer insulating film 17. Each routed wire 19h is covered by a second resin layer 20a disposed in the same layer and made of the same material as the second flattening film 20. As illustrated in FIG. 8, the first gate conductive layer 14a is disposed between the gate insulating film 13 and the first interlayer insulating film 15, and is electrically connected to signal wires (e.g., the gate line 14, the source line 19f, and the first power-source line 19g) within the TFT layer 30 in the display region D. As illustrated in FIG. 8, the second gate conductive layer 14b is disposed between the gate insulating film 13 and the first interlayer insulating film 15, and extends to the terminal section T.

The plurality of terminal wires 19k extend in parallel with each other in the direction orthogonal to the direction where the bending portion B extends. Each terminal wire 19k is disposed on the second interlayer insulating film 17, as illustrated in FIG. 8. The terminal wires 19k are disposed in the same layer and made of the same material (i.e., the third metal film) as the source electrode 19a and other components. As illustrated in FIG. 8, each terminal wire 19k has an end on the left side of the drawing, electrically connected to the second gate conductive layer 14b via a contact hole disposed in the stacked film of the first interlayer insulating film 15 and second interlayer insulating film 17. As illustrated in FIG. 8, the terminal wire 19k has an end on the right side of the drawing, exposed partly from a sixth resin layer 20c, thus forming a terminal. Herein, the sixth resin layer 20c is disposed in the same layer and made of the same material as the second flattening film 20.

The frame region F includes a frame wire 19i disposed in the form of a substantial C-shape outside the trench G, as illustrated in FIG. 1. The frame wire 19i have both ends reaching the terminal section T to be designed to receive a low power-source voltage, as illustrated in FIG. 1. The frame wire 19i is disposed in the same layer and made of the same material (i.e., the third metal film) as the source electrode 19a and other components.

The frame region F also includes a frame wire 19j disposed inside the trench G, as illustrated in FIG. 1. As illustrated in FIG. 1, the frame wire 19j includes a pair of first power-source trunk wires 19ja extending in the direction where each gate line 14 extends, and includes a pair of second power-source trunk wires 19jb extending in the direction where each source line 19f extends. The first power-source trunk wire 19ja near the terminal section T has both ends reaching the terminal section T to be designed to receive a high power-source voltage. Herein, the first power-source trunk wires 19ja and the second power-source trunk wires 19jb are integrally disposed in the same layer and made of the same material (i.e., the third metal film) as the source electrode 19a and other components. In addition, the first power-source trunk wires 19ja are electrically connected to the plurality of first power-source lines 19g. In addition, the second power-source trunk wires 19jb are electrically connected to the plurality of second power-source lines 16b via contact holes Hb and Hc disposed in the second interlayer insulating film 17 and the first flattening film 18, as illustrated in FIG. 9. In addition, the second power-source trunk wires 19jb and each gate line 14 intersect with each other via the first interlayer insulating film 15, the second interlayer insulating film 17, and the first flattening film 18, as illustrated in FIG. 10. In addition, although not shown, TFTs and other components forming a gate driver circuit, for instance, are disposed on both sides on the right and left of the trench G in FIG. 1 (i.e., the right and left sides of the drawing).

The organic EL display device 50a is designed to display an image by, in each sub-pixel, inputting a gate signal to the first TFT 9a through the gate line 14 to turn on the first TFT 9a, applying a predetermined voltage corresponding to a source signal to the gate electrode 14b of the second TFT 9b and to the capacitor 9c through the source line 19f to define the magnitude of a current from the first power-source line 19g on the basis of the gate voltage of the second TFT 9b, and supplying the defined current to the organic EL layer 33 to cause the light-emitting layer 3 of the organic EL layer 33 to emit light. In the organic EL display device 50a, the gate voltage of the second TFT 9b is maintained by the capacitor 9c even when the first TFT 9a is turned off; hence, the light-emitting layer 3 keeps light emission until a gate signal in the next frame is input.

A method for manufacturing the organic EL display device 50a according to this embodiment will be described. The method for manufacturing the organic EL display device 50a in this embodiment includes a step of forming a TFT layer, a step of forming an organic EL element, and a step of forming a sealing film.

Step of Forming TFT Layer

The TFT layer 30 is formed by forming, through a well-known method, the base coat film 11, the first TFTs 9a, the second TFTs 9b, the capacitors 9c, and the second flattening film 20 onto a surface of the resin substrate layer 10 disposed on a glass substrate, for instance.

Here, in patterning the gate insulating film 13, the first interlayer insulating film 15, and the second interlayer insulating film 17, a step of forming components, such as the contact holes Ha, Hb, and Hc, and a step of forming the slit S at the bending portion B may be performed simultaneously or separately.

Step of Forming Organic EL Element

The organic EL element 35 is formed by forming, through a well-known method, the first electrodes 31, the edge cover 32, the organic EL layers 33 (i.e., the hole injection layer 1, the hole transport layer 2, the light-emitting layer 3, the electron transport layer 4, and the electron injection layer 5), and the second electrode 34 onto the second flattening film 20 of the TFT layer 30 as formed in the step of forming a TFT layer.

Step of Forming Sealing Film

First, the first inorganic film 36 is formed by forming, through plasma CVD using a mask, an inorganic insulating film of about 1000 nm thickness (e.g., a silicon nitride film, a silicon oxide film, or a silicon oxide nitride film) onto the substrate surface provided with the organic EL element 35 after the step of forming an organic EL element.

Then, the organic film 37 is formed by forming, through an ink-jet method for instance, an organic resin (e.g., acrylic resin) film of about 10 μm thickness onto the substrate surface provided with the first inorganic film 36.

Furthermore, through plasma CVD using a mask, an inorganic insulating film of about 500 nm thickness (e.g., a silicon nitride film, a silicon oxide film, or a silicon oxide nitride film) is formed onto the substrate provided with the organic film 37, to form the second inorganic film 38, thus forming the sealing film 40.

Finally, a protective sheet (not shown) is attached onto the substrate surface provided with the sealing film 40, followed by laser light irradiation from the other surface of the resin substrate layer 10 adjacent to the glass substrate to peel the glass substrate off from the lower surface of the resin substrate layer 10, followed by attachment of another protective sheet (not shown) onto the lower surface of the resin substrate layer 10 with the glass substrate peeled off therefrom.

The organic EL display device 50a according to this embodiment can be manufactured through these process steps.

As described above, the organic EL display device 50a according to this embodiment includes, in the display region D, the second power-source lines 16b disposed between the plurality of gate lines 14, as well as the first power-source lines 19g disposed between the plurality of source lines 19f. Each first power-source line 19g and each second power-source line 16b are electrically connected together via the contact hole Ha disposed in the second interlayer insulating film 17. This configuration enables the first power-source lines 19g to have lower resistance, thus preventing brightness unevenness in the organic EL element 35. Here, each source line 19f and each second power-source line 16b, which intersect with each other via the second interlayer insulating film 17 and the first flattening film 18, can establish electrical insulation not only in the second interlayer insulating film 17 but also in both of the second interlayer insulating film 17 and first flattening film 18, thereby preventing a short circuit between the source line 19f and the second power-source line 16b. A short circuit between the source line 19f and the second power-source line 16b can be prevented, thereby preventing a line defect in the display region D.

SECOND EMBODIMENT

Figure 13:
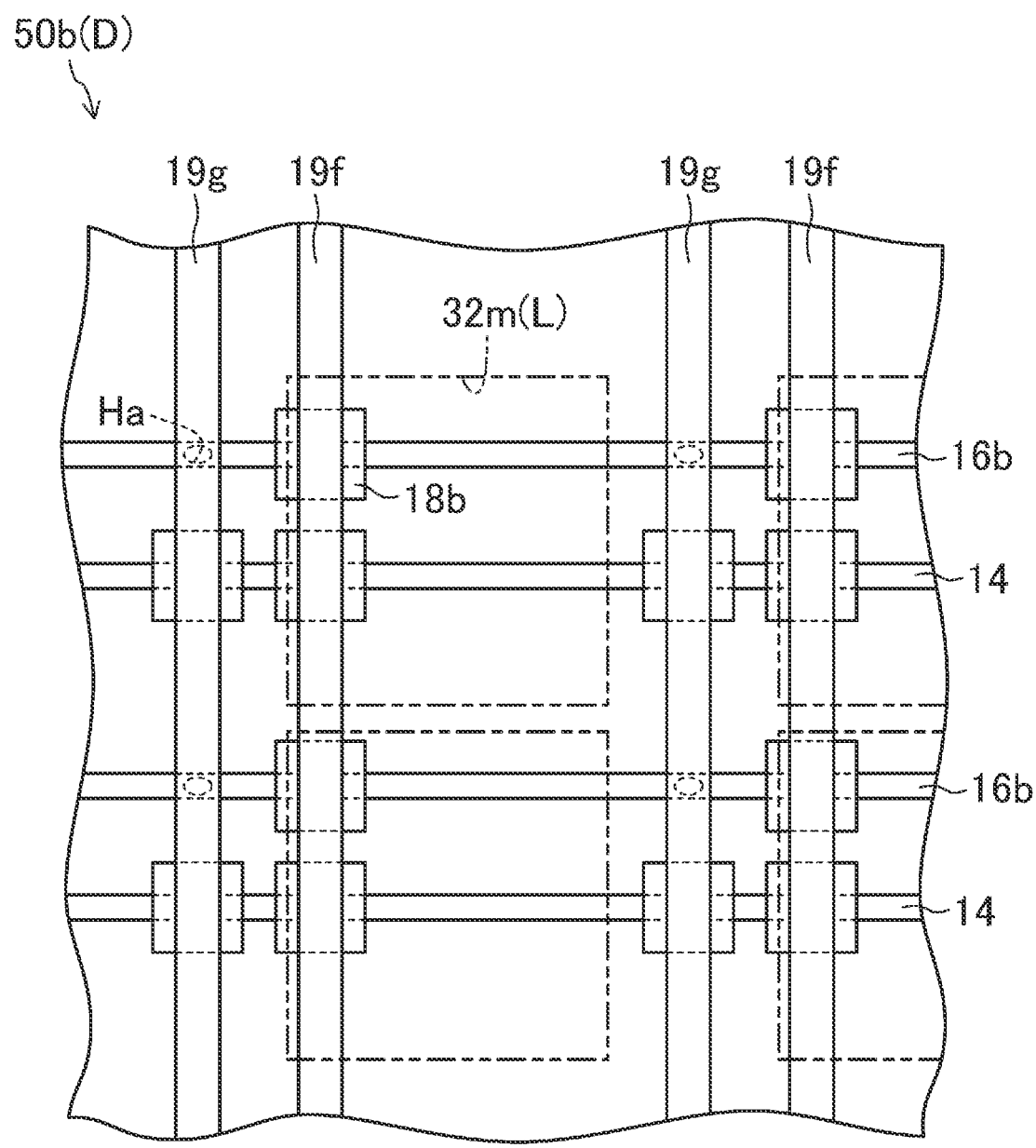
FIG. 13 is a plan view of the display region of an organic EL display device according to a second embodiment of the disclosure, and corresponds to FIG. 2.

FIG. 13 illustrates a second embodiment of the display device according to the disclosure. FIG. 13 is a plan view of the display region D of an organic EL display device 50*b* according to this embodiment, and corresponds to FIG. 2. In the subsequent embodiments, the same components as those illustrated in FIGS. 1 to 12 will be denoted by the same signs and will not be elaborated upon.

The first embodiment has described, by way of example, the organic EL display device 50*a* having the display region D in which the first flattening film 18 in the form of islands having the openings 18*m* is disposed. The second embodiment describes, by way of example, the organic EL display device 50*b* having the display region D in which a first flattening film 18*b* in the form of islands is disposed.

Like the organic EL display device 50*a* according to the first embodiment, the organic EL display device 50*b* includes the display region D and the frame region F disposed around the display region D.

Like the organic EL display device 50*a* according to the first embodiment, the organic EL display device 50*b* includes the following components in the display region D: the resin substrate layer 10; the TFT layer 30 disposed on the resin substrate layer 10; the organic EL element 35 disposed on the TFT layer 30; and the sealing film 40 disposed over the organic EL element 35.

As illustrated in FIG. 13, the TFT layer 30 of the organic EL display device 50*b* includes the first flattening film 18*b* disposed in the form of islands at the intersection of each source line 19*f* and each second power-source line 16*b*, at the intersection of each source line 19*f* and each gate line 14, and at the intersection of each first power-source line 19*g* and each gate line 14. Thus, in the TFT layer 30 of the organic EL display device 50*b*, the source electrodes 19*a* and 19*c*, the drain electrodes 19*b* and 19*d*, the source lines 19*f*, the first power-source lines 19*g*, and the frame wires 19*i* and 19*j*, all of which are disposed on the first flattening film 18 of the organic EL display device 50*a* according to the first embodiment, are disposed mainly on the second interlayer insulating film 17.

Like the organic EL display device 50*a* according to the first embodiment, the organic EL display device 50*b* includes the following components in the frame region F: the resin substrate layer 10; the inorganic insulating laminated film M disposed on the resin substrate layer 10; the first barrier wall Wa, second barrier wall Wb, routed wires 19*h*, and terminal wires 19*k* disposed on the inorganic insulating laminated film M; and the sealing film 40 disposed over the first barrier wall Wa and the second barrier wall Wb.

Like the organic EL display device 50*a* according to the first embodiment, the organic EL display device 50*b* is flexible, and is designed to display an image when the light-emitting layer 3 of the organic EL layer 33 is caused to emit light, as appropriate, via the first TFT 9*a* and the second TFT 9*b* in each sub-pixel.

The organic EL display device 50*b* according to this embodiment can be manufactured using the method for manufacturing the organic EL display device 50*a* according to the first embodiment, with the exception that the shape of the first flattening film 18 in plan view needs to be changed.

As described above, the organic EL display device 50*b* according to this embodiment includes, in the display region D, the second power-source lines 16*b* disposed between the plurality of gate lines 14, as well as the first power-source lines 19*g* disposed between the plurality of source lines 19*f*. Each first power-source line 19*g* and each second power-source line 16*b* are electrically connected together via the contact hole Ha disposed in the second interlayer insulating film 17. This configuration enables the first power-source lines 19*g* to have lower resistance, thus preventing brightness unevenness in the organic EL element 35. Here, each source line 19*f* and each second power-source line 16*b*, which intersect with each other via the second interlayer insulating film 17 and the first flattening film 18*b*, can establish electrical insulation not only in the second interlayer insulating film 17 but also in both of the second interlayer insulating film 17 and first flattening film 18*b*, thereby preventing a short circuit between the source line 19*f* and the second power-source line 16*b*. A short circuit between the source line 19*f* and the second power-source line 16*b* can be prevented, thereby preventing a line defect in the display region D.

THIRD EMBODIMENT

Figure 14:
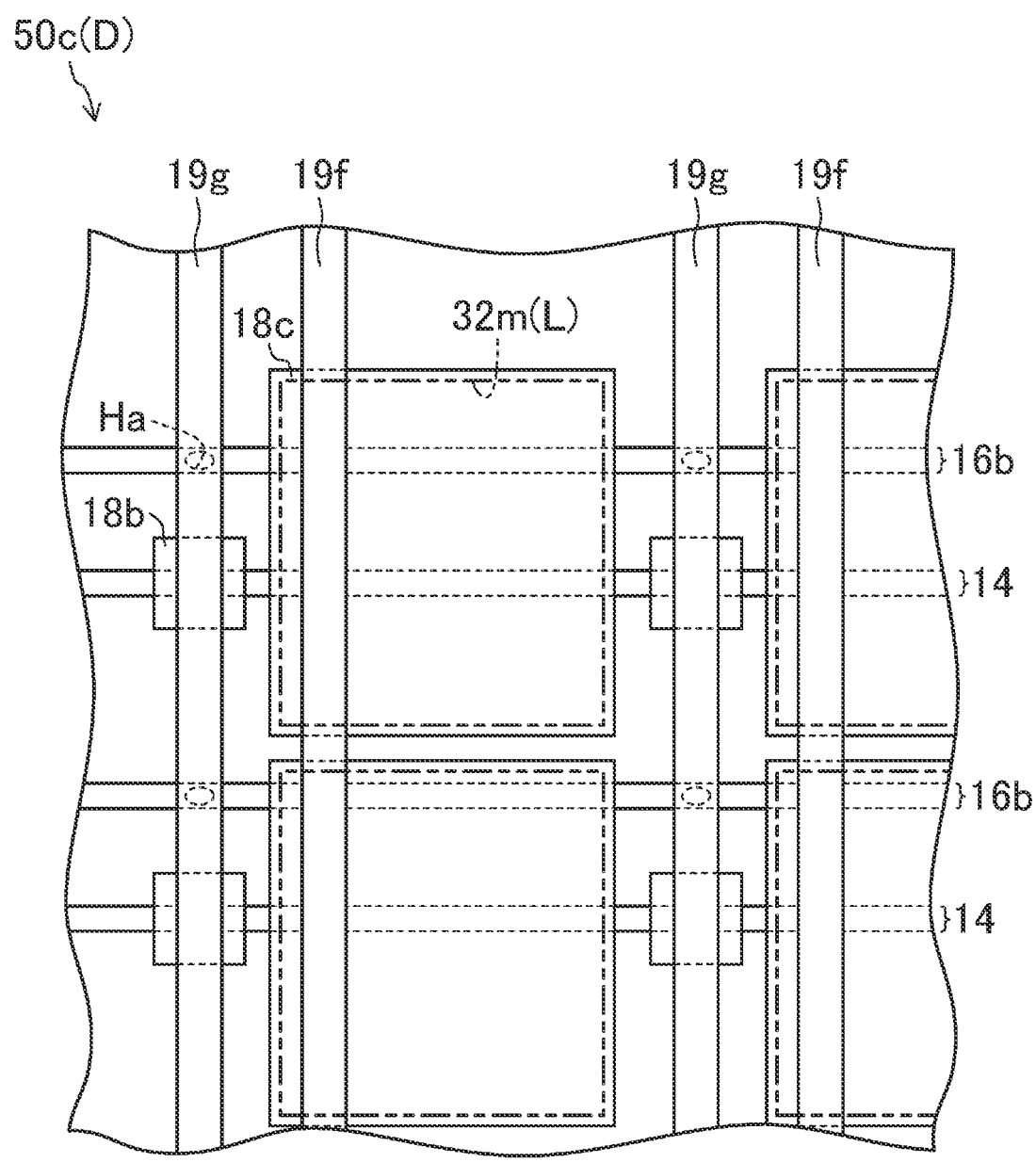
FIG. 14 is a plan view of the display region of an organic EL display device according to a third embodiment of the disclosure, and corresponds to FIG. 2.

FIG. 14 illustrates a third embodiment of the display device according to the disclosure. FIG. 14 is a plan view of the display region D of an organic EL display device 50*c* according to this embodiment, and corresponds to FIG. 2.

The second embodiment has described, by way of example, the organic EL display device 50*b* having the display region D in which the first flattening film 18*b* in the form of islands is disposed. The third embodiment describes, by way of example, the organic EL display device 50*c* having the display region D in which the first flattening film 18*b* in the form of islands and a first flattening film 18*c* in the form of islands are disposed.

Like the organic EL display device 50*a* according to the first embodiment, the organic EL display device 50*c* includes the display region D and the frame region F disposed around the display region D.

Like the organic EL display device 50 according to the first embodiment, the organic EL display device 50*c* includes the following components in the display region D: the resin substrate layer 10; the TFT layer 30 disposed on the resin substrate layer 10; the organic EL element 35 disposed on the TFT layer 30; and the sealing film 40 disposed over the organic EL element 35.

As illustrated in FIG. 14, the TFT layer 30 of the organic EL display device 50*c* includes the first flattening film 18*c* disposed in the form of islands at the intersection of each source line 19*f*, each second power-source line 16*b* and each gate line 14, and includes the other first flattening film 18*b* disposed in the form of islands at the intersection of each first power-source line 19*g* and each gate line 14. Here, the first flattening film 18*c* surround the corresponding opening 32*m* of the edge cover 32, as illustrated in FIG. 14. Thus, in the TFT layer 30 of the organic EL display device 50*c*, the source electrodes 19*a* and 19*c*, the drain electrodes 19*b* and 19*d*, the first power-source lines 19*g*, and the frame wires 19*i* and 19*j*, all of which are disposed on the first flattening film 18 of the organic EL display device 50*a* according to the first embodiment, are disposed mainly on the second interlayer insulating film 17. Furthermore, in the TFT layer 30 of the organic EL display device 50*c*, the source lines 19*f*, which are disposed on the first flattening film 18 of the organic EL display device 50*a* according to the first embodiment, are disposed mainly on the first flattening film 18*c*, as illustrated in FIG. 14.

Like the organic EL display device 50*a* according to the first embodiment, the organic EL display device 50*c* includes the following components in the frame region F:

the resin substrate layer 10; the inorganic insulating laminated film M disposed on the resin substrate layer 10; the first barrier wall Wa, second barrier wall Wb, routed wires 19h, and terminal wires 19k disposed on the inorganic insulating laminated film M; and the sealing film 40 disposed over the first barrier wall Wa and the second barrier wall Wb.

Like the organic EL display device 50a according to the first embodiment, the organic EL display device 50c is flexible, and is designed to display an image when the light-emitting layer 3 of the organic EL layer 33 is caused to emit light, as appropriate, via the first TFT 9a and the second TFT 9b in each sub-pixel.

The organic EL display device 50c according to this embodiment can be manufactured using the method for manufacturing the organic EL display device 50a according to the first embodiment, with the exception that the shape of the first flattening film 18 in plan view needs to be changed.

As described above, the organic EL display device 50c according to this embodiment includes, in the display region D, the second power-source lines 16b disposed between the plurality of gate lines 14, as well as the first power-source lines 19g disposed between the plurality of source lines 19f. Each first power-source line 19g and each second power-source line 16b are electrically connected together via the contact hole Ha disposed in the second interlayer insulating film 17. This configuration enables the first power-source lines 19g to have lower resistance, thus preventing brightness unevenness in the organic EL element 35. Here, each source line 19f and each second power-source line 16b, which intersect with each other via the second interlayer insulating film 17 and the first flattening film 18c, can establish electrical insulation not only in the second interlayer insulating film 17 but also in both of the second interlayer insulating film 17 and first flattening film 18c, thereby preventing a short circuit between the source line 19f and the second power-source line 16b. A short circuit between the source line 19f and the second power-source line 16b can be prevented, thereby preventing a line defect in the display region D.

The organic EL display device 50c according to this embodiment, which includes the first flattening film 18c surrounding the corresponding opening 32m of the edge cover 32, enables the first electrode 31 and the organic EL layer 33 to be flat, thus preventing scattering of the light emitted from the organic EL layer 33.

Other Embodiments

The foregoing embodiments have described, by way of example, an organic EL layer having a five-ply stack of a hole injection layer, a hole transport layer, a light-emitting layer, an electron transport layer and an electron injection layer. In some embodiments, an organic EL layer may be provided that has a three-ply stack of a hole injection-and-transport layer, a light-emitting layer and an electron transport-and-injection layer.

The foregoing embodiments have described, by way of example, an organic EL display device that has a first electrode as an anode and a second electrode as a cathode. The disclosure is also applicable to an organic EL display device in which the organic EL layer has an inverted stack of layers: the first electrode as a cathode and the second electrode as an anode.

The foregoing embodiments have described, by way of example, an organic EL display device that includes, as a drain electrode, an electrode of a TFT connected to the first electrode. The disclosure is also applicable to an organic EL display device that includes, as a source electrode, an electrode of a TFT connected to the first electrode.

The foregoing embodiments have described an organic EL display device as a display device by way of example. The disclosure is applicable to a display device that includes a plurality of light-emitting elements driven by current. For instance, the disclosure is applicable to a display device that includes quantum-dot light-emitting diodes (QLEDs), which are light-emitting elements using a quantum-dot-containing layer.

INDUSTRIAL APPLICABILITY

As described above, the disclosure is useful for a flexible display device.

The invention claimed is:
1. A display device comprising:
a resin substrate;
a TFT layer disposed on the resin substrate, the TFT layer comprising a stack of, in sequence, a first metal film, a first inorganic insulating film, a second metal film, a second inorganic insulating film, a first organic insulating film, a third metal film, and a second organic insulating film;
a light-emitting element disposed on the TFT layer and forming a display region;
a frame region disposed around the display region;
a terminal section disposed at an end of the frame region;
a bending portion extending in one direction between the display region and the terminal section;
a plurality of gate lines forming the TFT layer, the plurality of gate lines extending in parallel with each other in the display region, the plurality of gate lines comprising the first metal film;
a plurality of source lines forming the TFT layer, the plurality of source lines extending, in the display region, in parallel with each other in a direction where the plurality of source lines intersect with the plurality of gate lines, the plurality of source lines comprising the third metal film;
a plurality of first power-source lines forming the TFT layer, the plurality of first power-source lines extending, in the display region, in parallel with each other between the plurality of source lines, the plurality of first power-source lines comprising the third metal film;
a plurality of second power-source lines forming the TFT layer, the plurality of second power-source lines extending, in the display region, in parallel with each other between the plurality of gate lines, the plurality of second power-source lines comprising the second metal film; and
a plurality of routed wires forming the TFT layer, the plurality of routed wires extending, in the frame region, in parallel with each other in a direction intersecting with the one direction where the bending portion extends, the plurality of routed wires comprising the third metal film,
the bending portion including
a slit disposed in the first and second inorganic insulating films,
a first resin layer filling the slit, the first resin layer comprising the first organic insulating film,
the plurality of routed wires disposed on the first resin layer, and a second resin layer covering the plurality of routed wires, the second resin layer comprising the second organic insulating film, wherein each of the plurality of first power-source lines and each of the plurality of second power-source lines intersecting with each of the plurality of first power-source lines are electrically connected together via a contact hole disposed in the second inorganic insulating film, and each of the plurality of source lines and each of the plurality of second power-source lines intersect with each other via the second inorganic insulating film and the first organic insulating film.

2. The display device according to claim 1, wherein the first organic insulating film has an opening at an intersection of each of the plurality of first power-source lines and each of the plurality of second power-source lines, the opening surrounding the contact hole disposed in the second inorganic insulating film.

3. The display device according to claim 2, wherein the light-emitting element includes an edge cover having a plurality of openings each forming a light-emission region, and each opening disposed in the first organic insulating film does not overlap each of the plurality of openings of the edge cover.

4. The display device according to claim 3, wherein the first organic insulating film overlaps each of the plurality of openings of the edge cover.

5. The display device according to claim 1, comprising a third inorganic insulating film disposed between the first organic insulating film and the third metal film, wherein each of the plurality of first power-source lines and each of the plurality of second power-source lines intersecting with each of the plurality of first power-source lines are electrically connected together via a contact hole disposed in the second and third inorganic insulating films, and each of the plurality of source lines and each of the plurality of second power-source lines intersect with each other via the second inorganic insulating film, the first organic insulating film, and the third inorganic insulating film.

6. The display device according to claim 1, wherein the first organic insulating film is disposed in a form of an island at an intersection of each of the plurality of source lines and each of the plurality of second power-source lines.

7. The display device according to claim 6, wherein the light-emitting element includes an edge cover having a plurality of openings each forming a light-emission region, and the first organic insulating film surrounds each of the plurality of openings of the edge cover.

8. The display device according to claim 1, wherein in the display region, the plurality of gate lines and each of the plurality of source lines intersect with each other via the first and second inorganic insulating films and the first organic insulating film.

9. The display device according to claim 1, wherein in the display region, the plurality of gate lines and each of the plurality of first power-source lines intersect with each other via the first and second inorganic insulating films and the first organic insulating film.

10. The display device according to claim 1, wherein the frame region includes a first power-source trunk wire extending in a direction where each of the plurality of gate lines extends, the first power-source trunk wire comprising the third metal film, and a second power-source trunk wire extending in a direction where each of the plurality of source lines extends, the second power-source trunk wire comprising the third metal film, the first power-source trunk wire is electrically connected to the plurality of first power-source lines, and the second power-source trunk wire is electrically connected to the plurality of second power-source lines via a contact hole disposed in the second inorganic insulating film and the first organic insulating film.

11. The display device according to claim 10, wherein the second power-source trunk wire and each of the plurality of gate lines intersect with each other via the first and second inorganic insulating films and the first organic insulating film.

12. The display device according to claim 1, wherein the light-emitting element is an organic EL element.

* * * * *